(12) United States Patent
Gray

(10) Patent No.: US 6,817,534 B2
(45) Date of Patent: Nov. 16, 2004

(54) SMART CARD HAVING ADDITIONAL CONNECTOR PADS

(75) Inventor: Robert J. Gray, Costa Mesa, CA (US)

(73) Assignee: Litronic, Inc., Irvine, CA (US)

( * ) Notice: Subject to any disclaimer, the term of this patent is extended or adjusted under 35 U.S.C. 154(b) by 0 days.

(21) Appl. No.: 10/408,545

(22) Filed: Apr. 7, 2003

(65) Prior Publication Data

US 2003/0168515 A1 Sep. 11, 2003

Related U.S. Application Data

(63) Continuation of application No. 09/993,810, filed on Nov. 6, 2001, now Pat. No. 6,634,565.

(51) Int. Cl.[7] .............................................. G06K 19/06
(52) U.S. Cl. ....................... 235/492; 235/487; 235/441
(58) Field of Search ................................ 235/492, 487, 235/441; 343/788, 86

(56) References Cited

U.S. PATENT DOCUMENTS

| | | | |
|---|---|---|---|
| 5,599,203 A | 2/1997 | Broschard, III | |
| 6,109,530 A | 8/2000 | Larson et al. | |
| 6,132,229 A | 10/2000 | Wu | |
| 6,168,077 B1 | 1/2001 | Gray et al. | |
| 6,370,029 B1 | 4/2002 | Kawan | |
| 6,568,600 B1 * | 5/2003 | Carpier et al. | 235/492 |
| 6,641,049 B2 * | 11/2003 | Luu | 235/492 |
| 2003/0024996 A1 * | 2/2003 | Muehlberger et al. | |

OTHER PUBLICATIONS

ISO/IEC; International Standard; ISO/IEC 7816–1; "Identification Cards—Integrated Circuit(s) Cards with Contacts, Part 1: Physical Characteristics"; 1998.
ISO/IEC; International Standard; ISO/IEC 7816–2; "Information Technology–Identification Cards–Integrated Circuit(s) Cards with Contacts"; Part 2: Dimensions and Location of the Contacts; 1999.
ISO/IEC; International Standard; ISO/IEC 7816–3; "Information Technology–Identification Cards–Integrated Circuit(s) Cards with Contacts"; Part 3: Electronic Signals and Transmission Protocols; 1997.
"The PowerMac G4" Internet article.
"Tyan Tiger 230, VIA Apollo Pro133 ChipSet Dual Processor, Motherboard" Internet Article.

* cited by examiner

*Primary Examiner*—Karl D. Frech
*Assistant Examiner*—Daniel A. Hess
(74) *Attorney, Agent, or Firm*—Stetina Brunda Garred & Brucker

(57) ABSTRACT

A smart card, having a set of standardized contact pads and an additional set of contact pads to provide additional performance characteristics. The additional contact pads are formed on the smart card on the area located between the ISO 7816 standardized contact pads C1 through C4 and C5 through C8, which area was previously used solely as a ground plane connection to contact pad C5. By increasing the number of contact pads, the additional pads can be used for input/output connections, memory, flash memory and/or interfaces with specific functions such as a service provided interface.

5 Claims, 5 Drawing Sheets

SMART CARD HAVING ADDITIONAL CONNECTOR PADS

CROSS-REFERENCE TO RELATED APPLICATIONS

This application is a continuation of 09/993,810 filed Nov. 6, 2001, now U.S. Pat. No. 6,634,565.

STATEMENT RE: FEDERALLY SPONSORED RESEARCH/DEVELOPMENT (Not Applicable)

BACKGROUND OF THE INVENTION

The present invention relates generally to electronic devices, and more particularly to an electronic integrated circuit card, i.e., smart card, that provides additional electrical connectors or contact pads, so as to provide additional functional capability, speed and/or larger memory capacity for the smart card.

The typical prior art smart card contains an integrating circuit processor, a small amount of memory, and an interface circuit. Typical applications of prior art smart cards include telephone calling cards and stored value cards. More recently, smart cards have been utilized to control access of users to various systems such as banking, internet or other electronic security systems.

Currently, most prior art smart cards are fabricated in accordance with an international standard, namely the International Standard Organization/International Electrotechnical Commission (ISO) 7816 standard. As is well known, in the ISO 7816 standard a card reader is employed to interface between the smart card and a host computer. The card reader communicates with the smart card in accordance with the ISO 7816 standard, and communicates with the host computer via an interface such as a RS-232, a PS/2 or a universal serial bus (USB). One example of a specialized prior art smart card and card reader and its communication protocol with a host computer is disclosed in United States Letters Patent No. 6,168,077 entitled Apparatus and Method of Providing a Dual Mode Card and Reader issued Jan. 2, 2001 assigned to Litronic, Inc., the Assignee of the subject application, the disclosure of which is expressly incorporated herein by reference.

The ISO 7816 standard specifies the dimensions, locations and assignment for each of the electrical contacts or contact zones formed on the smart card which then interface with conventional smart card readers. The plural contact zones or pads are designated by the ISO 7816 standard as zones or pads C1 through C8. The pads C1 through C4 are separated by a central region on the card from pads C5 through C8. This void or central region has heretofore been utilized to facilitate the mounting of the integrated circuit die with the integrated circuit die being attached on one side of the carrier while the contact pads C1 through C8 being formed and disposed on the opposite side of the carrier. The integrated circuit die has hereto been electrically connected to the contact pads C1 through C8 via conventional bonding wiring techniques which require that the central area of the carrier existing between the contact pads C1 through C8 be connected to ground via contact pad C5. As a result, the entire central region or portion of the carrier located between the contact pads C1 through C4 and C5 through C8 has not been available for additional contact pads, but rather has been used solely to provide mounting of the integrated circuit die to the smart card.

In view of the above, the number of connector zones to the smart card have been limited to the zones C1 through C8 which, as will be explained in more detail infra, serves to limit the function and memory of prior art smart cards.

As such, there exists a substantial need in the art to provide additional conductive pads on a conventional smart card in conformity with the ISO 7816 standard which enables such additional contact pads to be utilized for additional purposes such as to enable greater memory, communications, processing speeds and the like.

SUMMARY OF THE INVENTION

The present invention specifically addresses and alleviates the above-referenced deficiencies in the prior art. More particularly, the present invention contemplates the use of additional contact pads being formed on the smart card in the area located between the contact pads C1 through C4 and C5 through C8, which space heretofore has been used solely as a ground plane connected to contact pad C5. By increasing the number of contact pads, the additional pads can be used for numerous desired purposes such as input/output connections, memory and/or interfaces with specific functions, such as Serial Peripheral Interface (SPI).

To increase the number of contact pads, the present invention utilizes a flip chip package mounting technique for the integrated circuit processor which replaces the conventional prior art wire bonding die mounting technique. In the present invention, the integrated circuit flip chip is formed with an array of solder bumps or solder balls on one side thereof. The flip chip is mounted on a printed circuit board with the solder bumps connected to a printed circuit formed on the printed circuit board. Through vias formed in the printed circuit board, the flip chip pads and solder bumps are electrically connected to the contact pads formed on the opposing surface of the printed circuit board. Since the electrical connections between the flip chip and the contact pads is facilitated by the traces of the printed circuit board, which can be located beneath the flip chip (as opposed to only on the periphery thereof), the central area of the printed circuit is now free to include additional contact pads thereon. As a result, in addition to the contact pads standardized by ISO 7816, additional contact pads are provided which facilitate additional functions and/or interfaces to the smart card integrated circuit.

Preferably, the smart card connectors or pads provided by the present invention comprise the eight ISO 7816 standardized contact pads C1 through C8 and an additional five contact pads designated C9 to C13 which are available for more connections as desired. However, those skilled in the art will recognize that the number of additional contact pads may be varied as desired.

By use of the additional contact pads formed in the present invention, the integrated circuit and the functionality of the smart card can be significantly enhanced, for instance, incorporating differing communication ports, such as USB, SPI and SMB (System Management Bus) ports that communicates with devices in the reader such as serial memory and a real-time clock.

In one embodiment of the present invention, to communicate with the smart card, a conventional card reader can be modified with more connectors corresponding to the additional contact pads on the smart card that communicate with circuitry on the reader. Alternatively, two additional contact modules can be embedded in one smart card. Interconnects are formed to establish a mutual communication between these two die modules via circuitry in the reader.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
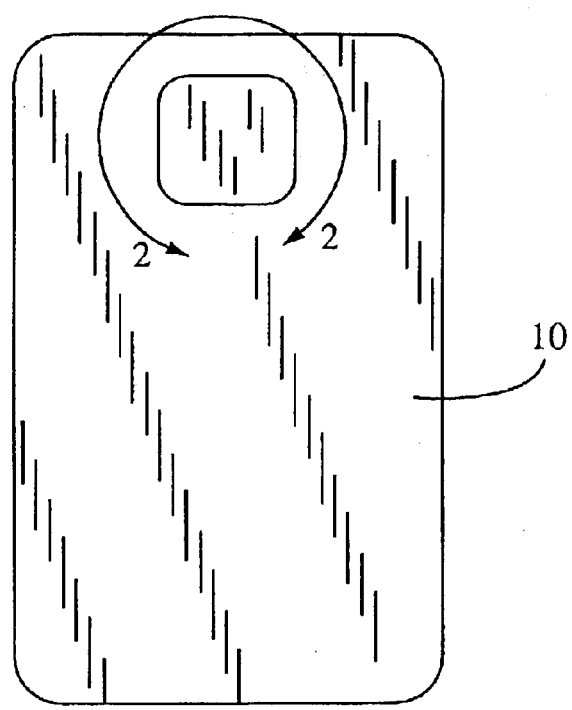
FIG. 1 is a top plan view showing the standardized ISO 7816 connector pattern of a prior art smart card.
Figure 2:
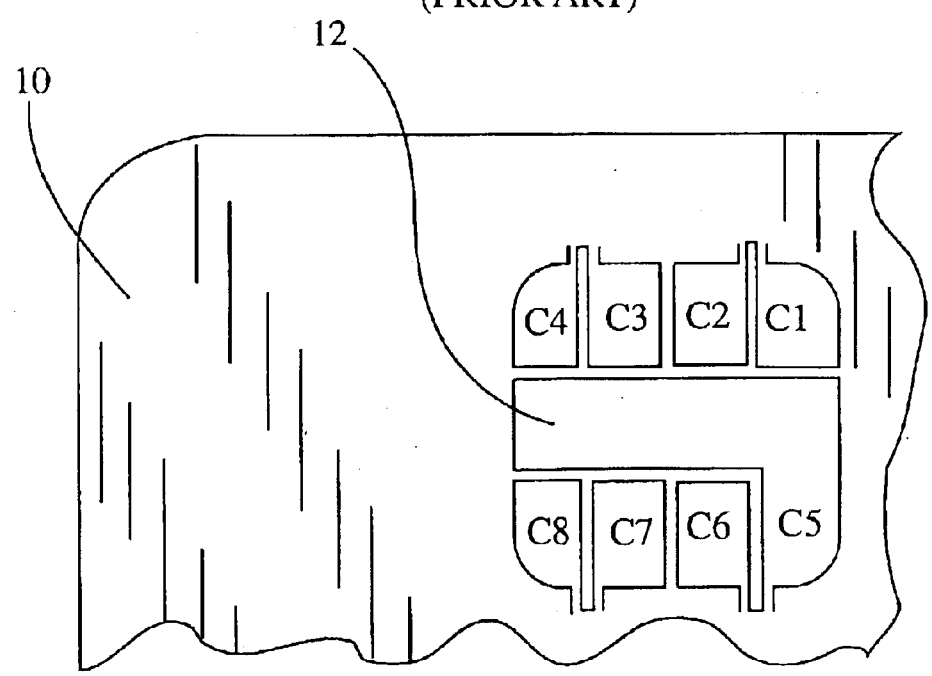
FIG. 2 is an enlarged partial view of the smart card illustrated as FIG. 1 depicting the location and size of the conducting pads/zones C1 through C8.

FIG. 1 and FIG. 2 depict a conventional prior smart card 10. As specified by the ISO 7816 standard, the smart card has a specific connector/pad or zone pattern with eight flat contact pads designated C1–C8 formed on a carrier disposed within the smart card 10. The contact assignment for these contact pads is standardized as follows: The contact pad C1 is connected to a supplied voltage VCC. The contact pad C2 is assigned for a reset signal (RST). The contact pad C3 is assigned for a clock signal CLK. The contact pad C4 is reserved for future use in other parts of ISO/IEC 7816. The contact pad C5 is grounded (GND). The contact pad C6 is assigned for variable supply voltage, that is, the programming voltage VPP. The contact pad C7 is an input/output (I/O) pad for data input/output. The contact pad C8 is also reserved for future use in other pads of ISO/IEC 7816.

Figure 3:
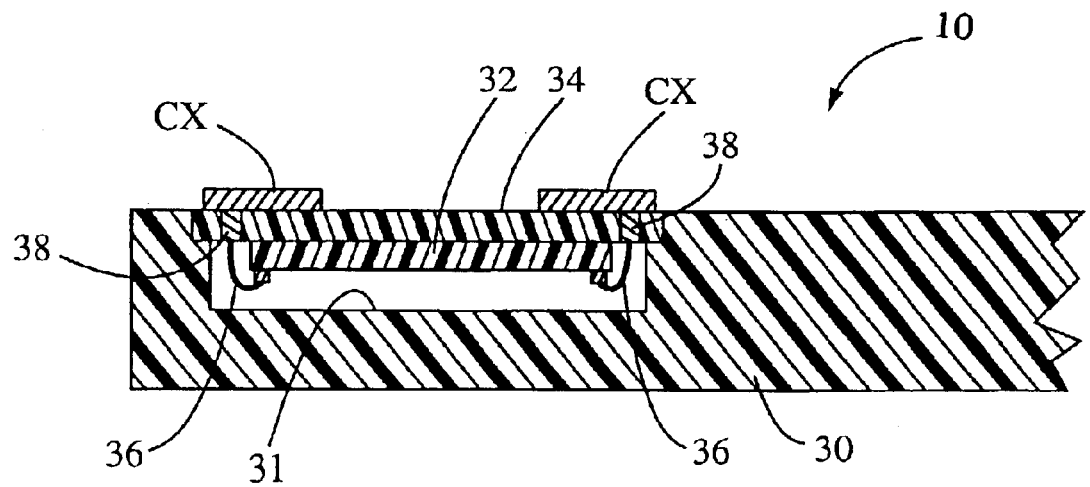
FIG. 3 is a side view illustrating the prior art wire bonding mounting of the integrated circuit die into the smart card of FIG. 1.

As shown in FIG. 2, the center portion 12 of the carrier is typically electrically connected to the contact pad C5. In the prior art, this center portion 12 is used to mount the smart card integrated circuit chip or die (with pads pointing up and away from the ground plane) via a conventional wire bonding packaging technique. The specifics of the conventional wire bonding packing technique are illustrated in FIG. 3. As shown, the card blank 30 of the smart card 10 is milled to form a cavity 31 to accommodate the integrated circuit die 32. The integrated circuit die 32 is mounted on a carrier 34, typically comprising a thin film printed circuit board. The central portion of the carrier 34 is thus occupied by the integrated circuit die 32. Bonding wires 36 are formed to electrically connect the respective pads on the integrated circuit die 32 to the carrier 34 peripheral to the integrated circuit die 32. As a result, peripheral contact pads CX (C1–C8) are formed to route the pads of the integrated circuit die 32 through vias 38 formed in the carrier 34. As the center portion 12 of the carrier 34 is occupied by mounting the integrated circuit chip 36, the connectors (contact pads CX) can only be arranged on the periphery of the die 32 and card blank 30, thus leaving the central portion typically being connected to the ground pad C5.

Due to the integrated circuit chip or die 36 occupying the center portion 12, the ISO 7816 standard only utilizes connector pads C1 through C4 and C5 through C8 for various assignments as previously mentioned. Thus, with the standardized prior art ISO 7816 configuration, the prior art smart card 10 normally incorporates only an 8 byte microprocessor, a 256-byte SRAM, a 48K-byte ROM and a 16K-byte EEPROM to operate with the frequency of about 3.579 MHz and having only an ISI serial port. As such, improved operational function, communication and speed of the prior art smart card 10 has been limited.

In contrast to the prior art, the present invention specifically utilizes a flip chip mounting technique for the integrated circuit which allows the central portion 12 of the smart card 10a to be utilized for additional pad connectors.

Figure 4:
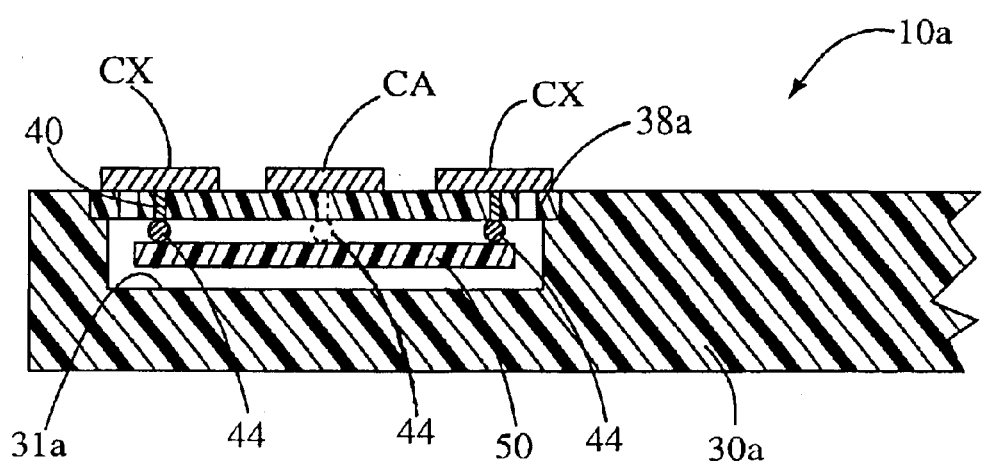
FIG. 4 illustrates the present invention's flip chip mounting of the integrated circuit flip chip into the smart card body.
Figure 5:
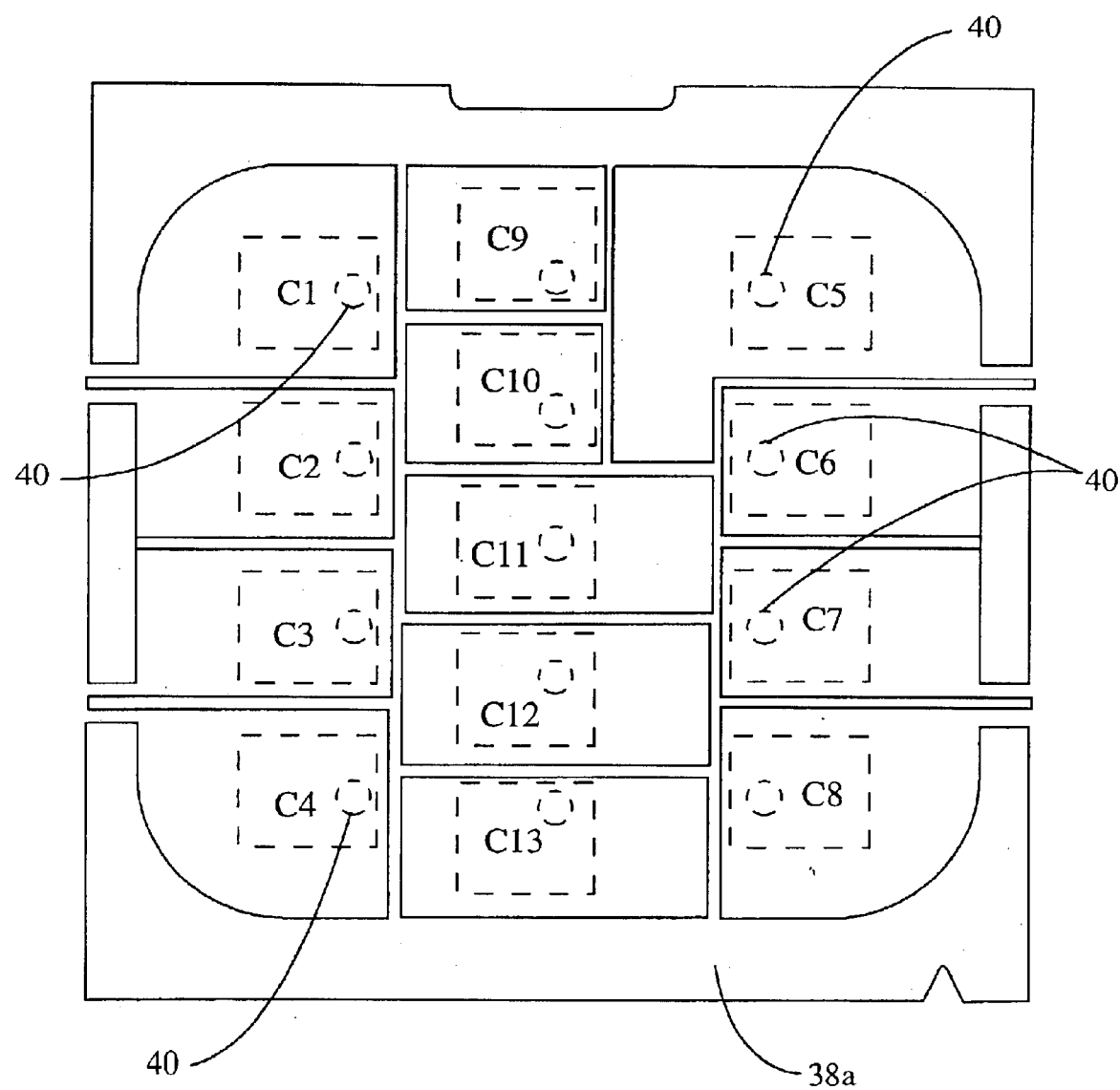
FIG. 5 comprises a plan view of the connector pattern of the present invention formed on the contact side of the printed circuit board of the smart card of the invention.
Figure 6:
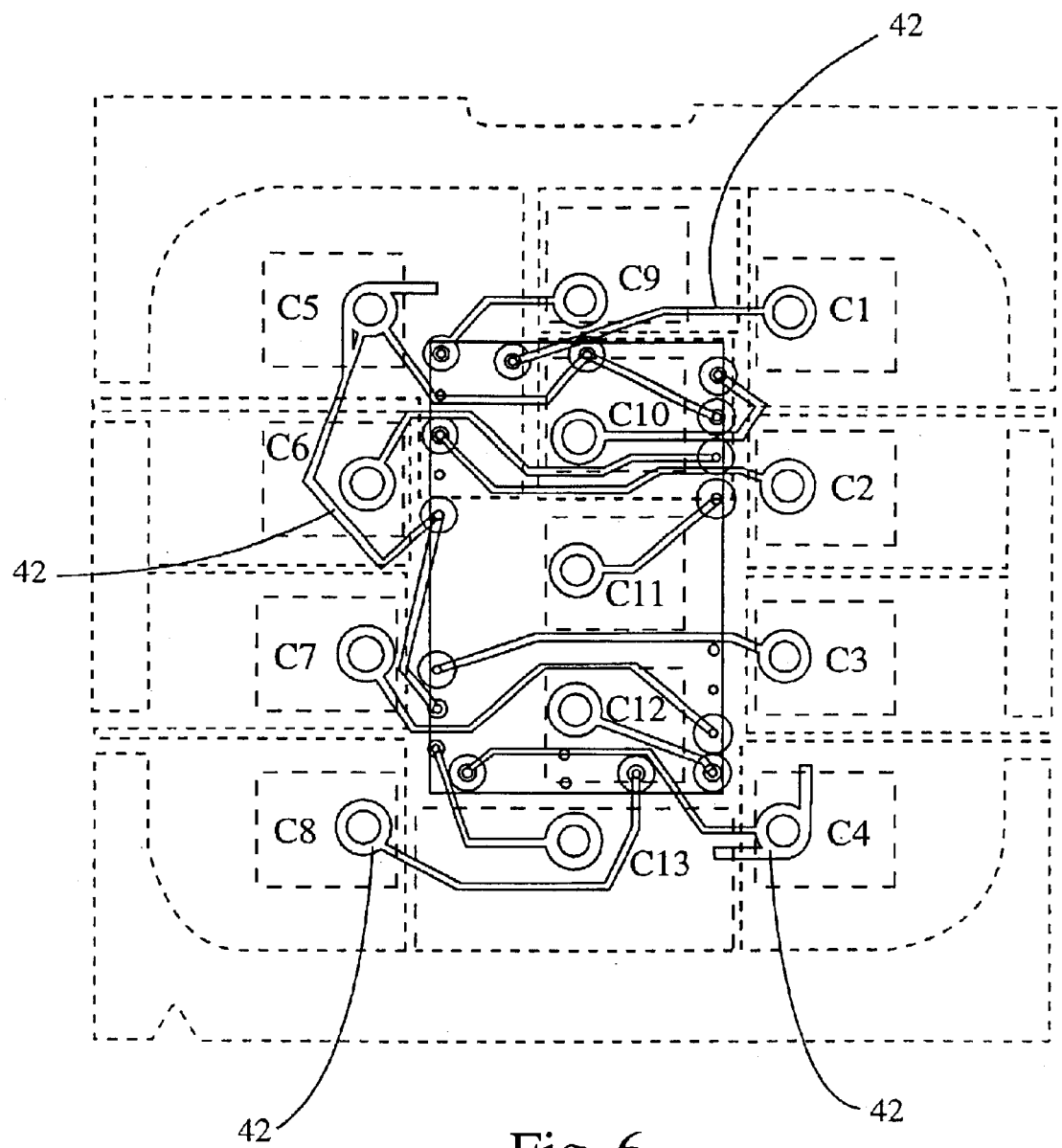
FIG. 6 comprises a plan view of the bonding side of the printed circuit board of the smart card of the present invention.

Referring more particularly to FIGS. 4, 5 and 6, the particular flip chip mounting technique utilized in the present invention is depicted. As in the prior art, a cavity 31a is formed in the smart card blank 30a and a printed circuit board 38a is mounted therein, preferably fabricated from a thin film. Utilizing conventional printed circuit board fabrication technology, plural electrical contact pads CX (C1 through C8) are formed on the contact side surface of the circuit board as depicted in FIG. 5, which pads C1 through C8 are formed in exact conformity with the ISO 7816 standard. However, as shown in FIG. 5, the contact side of the printed circuit board 38a of the present invention additionally defines preferably five additional connector pads CA designated individually in FIG. 5 as C9, C10, C11, C12 and C13. Each of the connector pads C1 through C13 include a via 40 which extends through the circuit board 38a from the contact side to the opposite bonding side of the printed circuit board.

The opposite bonding side of the circuit board 38a is depicted in FIG. 6. The bonding side includes suitable printed circuit board tracing 42 which extend from each of the vias 40 to mounting pad locations for the integrated circuit flip chip 50. Although differing flip chip processors 50 are contemplated in the present invention, in the preferred embodiment, a nimbus brand flip chip manufactured by Atmel of San Jose, Calif. is utilized. As is known and shown in FIG. 4, the flip chip 50 includes plural solder bumps 44 at mounting pad locations which are utilized for mounting and forming electrical connections through the plural vias 40 to each of the mounting pads C1 through C13. Since the printed circuit board tracings 42 can be routed upon the bonding side of the printed circuit board to all vias (even those located under the flip chip 50), the previously unused central portion of the printed circuit board can now serve to provide additional electrical connections to desired connections for the integrated circuit die. In this matter, the central portion of the printed circuit board 38a is thereby freed in the present invention to accommodate the additional electrical pad connections C9 through C13 to provide additional input/output connections and communication connections to the smart card without increasing the overall contact size as defined by the ISO 7816 standard.

Figure 7:
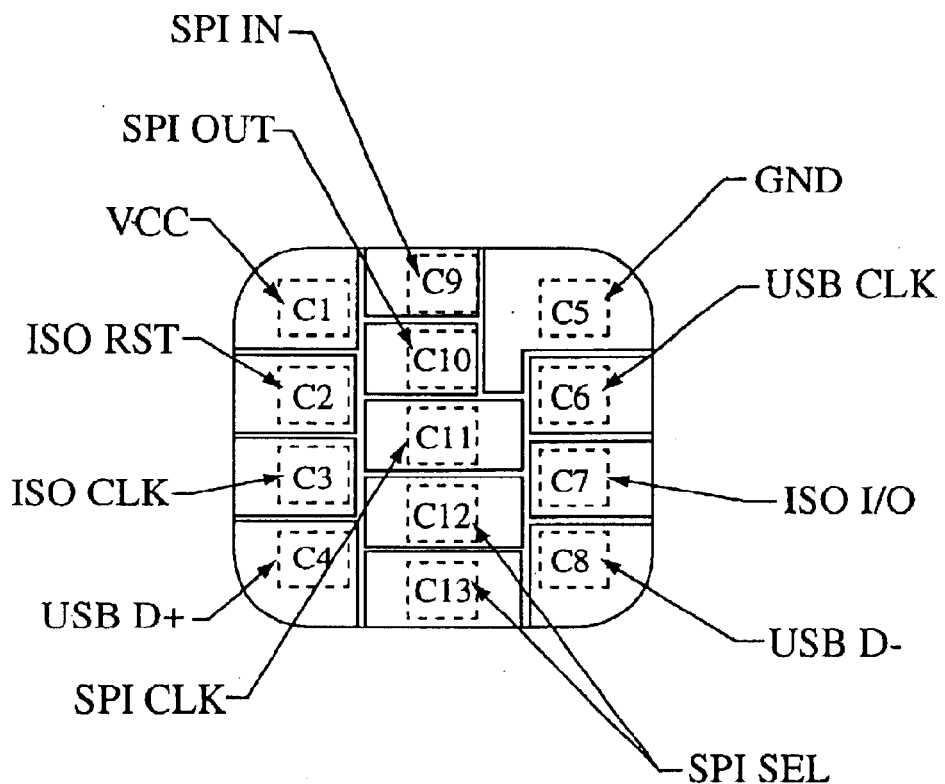
FIG. 7 depicts a specific application for SPI of the smart card of the present invention.

As best shown in FIG. 7, the conventional connector pads C1 through C8 can be utilized for the same assignments as defined in the ISO 7816 standard. However, the additional connector pads C9 through C13 can be utilized for various purposes. FIG. 7 depicts a preferred designation especially suitable for SPI applications. As shown in FIG. 7, the contact pad C1 is assigned for the power supply VCC, the contact pad C2 is assigned for the reset signal RST, the contact pad C3 is assigned, for the clock signal, the contact pad C5 is connected to the ground, and the contact pad C6 is assigned for the USB clock signal (USBCLK, the program voltage supply VPP). The contact pad C7 is assigned for ISO input/output. The contact pad C4 and C8 which were previously reserved and unused can now be assigned for USB to connect a PC, a work station or other electronic apparatus. The contact pad C9 can be assigned for SPI input. The contact pad C10 can be assigned for SPI output. The contact pad C1 may be assigned for SPI clock signal and the contact pad C12 and C13 may be assigned for select signals SPISEL.

By such an arrangement, the smart card 10a of the present invention achieves substantial improved functionality having, for instance, a 32-byte microprocessor, 5K-byte SRAM, 96K-byte ROM, 64K-byte EEPROM and operating with a frequency of 16 MHz having an ISO port, a high speed USB port, a serial interface port and an SMB port. As such, by way of the present invention, increased performance for the smart card 10a is achieved.

Those skilled in the art will recognize that the smart card of the present invention can be utilized in conventional smart card readers having conventional spring contacts corresponding to pads C1 through C8 in a manner heretofore utilized in the prior art. However, such conventional card readers can additionally be easily modified to include additional corresponding spring contacts to register and interface with the additional connector pads C9 and C13 such that same can be utilized as desired.

Figure 8:
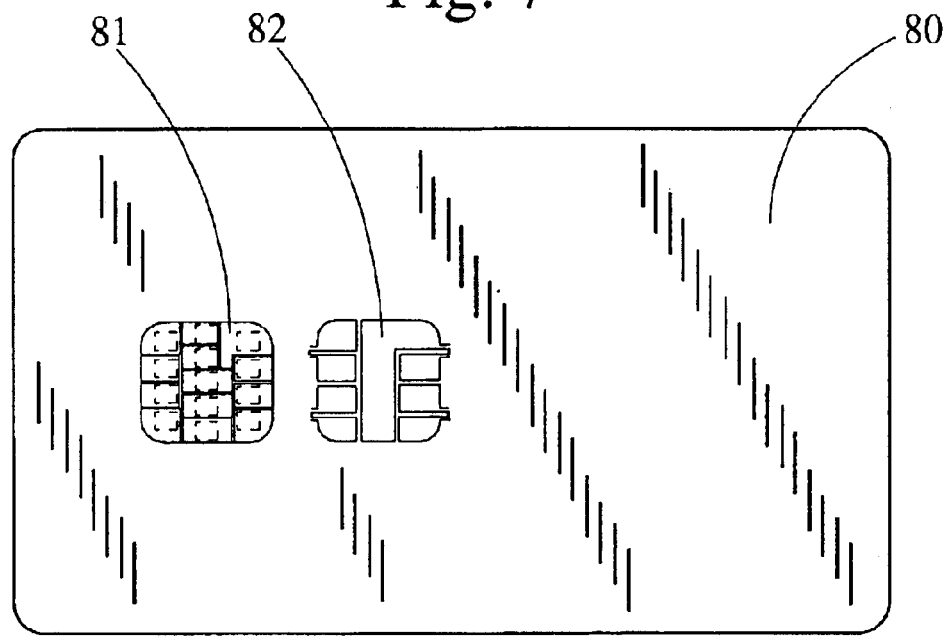
FIG. 8 shows a dual die module smart card of the present invention.

FIG. 8 shows an additional embodiment of the present invention wherein the smart card 80 includes two integrated circuit modules 81 and 82 embedded therein. The integrated circuit die 81 has both the standardized connector pads C1 through C8 and the additional connector pads C9 through C13 as described above. The integrated circuit module 82 includes only the standardized connectors C1 through C8. Electrical connections between the modules 81 and 82 are achieved using conventional PCB interconnection on the smart card.

After inserting the smart card 80 into a prior art card reader, only the connectors C1 through C8 of the integrated circuit die 82 are in direct contact with the reader. That is, a direct communication is only established between the card reader and the module 82. The communication for the module 81 is established indirectly via the interconnect coupled to the integrated circuit module 82. In this manner, conventional card readers can be utilized to read the module 81 embedded in the smart card 80. It will be appreciated that the number of the modules 81 in the smart card 80 is not limited to one only. One of ordinary skill in the art may modify the embodiment by embedding more than one module 81 in the same smart card to obtain more functionalities.

Those skilled in the art will appreciate that the particular assignments made for the additional connector pads C9 and C13 are illustrated in FIG. 7 is solely for illustration purposes and comprise only one of a variety of connector pad assignments for the smart card of the present invention. In other applications, the connector pads C9 through C13 may be assigned to facilitate completely different functions, such as input/output, flash memory or the like, to be capable of accommodating specific operational requirements.

Indeed, each of the features and embodiments described herein can be used by itself, or in combination with one or more of other features and embodiment. Thus, the invention is not limited by the illustrated embodiment but is to be defined by the following claims when read in the broadest reasonable manner to preserve the validity of

What is claimed is:

1. A smart card for communicating with a card reader, comprising:

a card body, milled with a cavity;

an integrated circuit, disposed in the cavity of the card body;

a printed circuit board, having a first side bonded with the integrated circuit by a plurality of solder bumps, and an opposite second side facing upwardly from said cavity; and a plurality of contact pads formed on said second side of the printed circuit board, through which electrical connections from the integrated circuit die to the card reader is establish; wherein the contact pads comprising eight ISO 7816 standardized contact pads and a plurality of additional contact pads between the ISO 7816 standardized contact pads.

2. A smart card, comprising:

a card body;

a first die module embedded in the card body with a plurality of first contact pads; and a second die module embedded in the card body with at least the first contact pads, wherein the first die module is electrically connected directly to the second die module.

3. The smart card according to claim 2, wherein the first contact pads include eight standardized contact pads and the second die module further includes a plurality of additional I/O connection pads.

4. The smart card according to claim 3, wherein the first contact pads of the first and second die module are sized and configured in conformity with the ISO 7816 standard.

5. The smart card according to claim 4, wherein the second die module comprises five additional I/O connection pads between the first contact pads.

* * * * *